(12) United States Patent
Baskett

(10) Patent No.: US 7,135,924 B2
(45) Date of Patent: Nov. 14, 2006

(54) CROSS-TALK REDUCTION CIRCUIT AND METHOD THEREFOR

(75) Inventor: Ira E. Baskett, Tempe, AZ (US)

(73) Assignee: Semiconductor Components Industries, L.L.C., Phoenix, AZ (US)

( * ) Notice: Subject to any disclaimer, the term of this patent is extended or adjusted under 35 U.S.C. 154(b) by 175 days.

(21) Appl. No.: 11/044,452

(22) Filed: Jan. 28, 2005

(65) Prior Publication Data

US 2006/0170494 A1   Aug. 3, 2006

(51) Int. Cl.
*H03F 3/45* (2006.01)
(52) U.S. Cl. ......................... 330/252; 330/51
(58) Field of Classification Search ................ 330/252, 330/51, 254, 261
See application file for complete search history.

(56) References Cited

U.S. PATENT DOCUMENTS

| | | | | | |
|---|---|---|---|---|---|
| 4,127,820 | A | * | 11/1978 | Beelitz et al. | 455/180.2 |
| 6,023,196 | A | * | 2/2000 | Ashby et al. | 330/290 |
| 6,300,845 | B1 | * | 10/2001 | Zou | 332/178 |
| 6,650,883 | B1 | * | 11/2003 | Stephane et al. | 455/313 |

OTHER PUBLICATIONS

"An Outline of Design Techniques for Linear Integrated Circuits", Hans R. Camenzind and Alan B. Grebene, IEEE Journal of Solid-State Circuits, Jun. 1969, pp. 110-122.

* cited by examiner

*Primary Examiner*—Henry Choe
(74) *Attorney, Agent, or Firm*—Robert F. Hightower

(57) ABSTRACT

In one embodiment, a pair of differential amplifiers have outputs coupled together. A signal received on one input results in signals coupled to the outputs that substantially cancel each other at the outputs.

20 Claims, 2 Drawing Sheets

CROSS-TALK REDUCTION CIRCUIT AND METHOD THEREFOR

This application is related to co-pending application Ser. No. 11/009,585 filed Dec. 13, 2004 entitled HIGH SLEW ECL DEVICE AND METHOD THEREFOR by the same inventor and having a common assignee.

BACKGROUND OF THE INVENTION

The present invention relates, in general, to electronics, and more particularly, to methods of forming semiconductor devices and structure.

In the past, the semiconductor industry utilized various methods and structures to form digital circuits using differential amplifiers. For example differential amplifiers were used to form emitter coupled logic (ECL) circuits such as multiplexers and flip-flops. These differential amplifier circuits typically utilized multiple differential amplifiers that shared the collectors of some of the transistors that were used to form the differential amplifiers. For example, a collector of one transistor of a differential pair could be connected to a collector of an equivalent transistor of another differential pair. Under some operating conditions the first differential pair may be disabled. If a signal were applied to the input of a disabled transistor, a parasitic capacitance of the disabled transistor caused cross-talk that affected the output signal resulting in jitter in the output signal and false triggering of other circuits that were connected to the output.

Accordingly, it is desirable to have a method of reducing crosstalk in circuits that have shared transistors, and reducing jitter in the output signal.

For simplicity and clarity of illustration, elements in the figures are not necessarily to scale, and the same reference numbers in different figures denote the same elements. Additionally, descriptions and details of well-known steps and elements are omitted for simplicity of the description. As used herein current carrying electrode means an element of a device that carries current through the device such as a source or a drain of an MOS transistor or an emitter or a collector of a bipolar transistor or a cathode or anode of a diode, and a control electrode means an element of the device that controls current through the device such as a gate of an MOS transistor or a base of a bipolar transistor. Although the devices are explained herein as certain NPN transistors, a person of ordinary skill in the art will appreciate that complementary devices are also possible in accordance with the present invention.

DETAILED DESCRIPTION OF THE DRAWINGS

Figure 1:
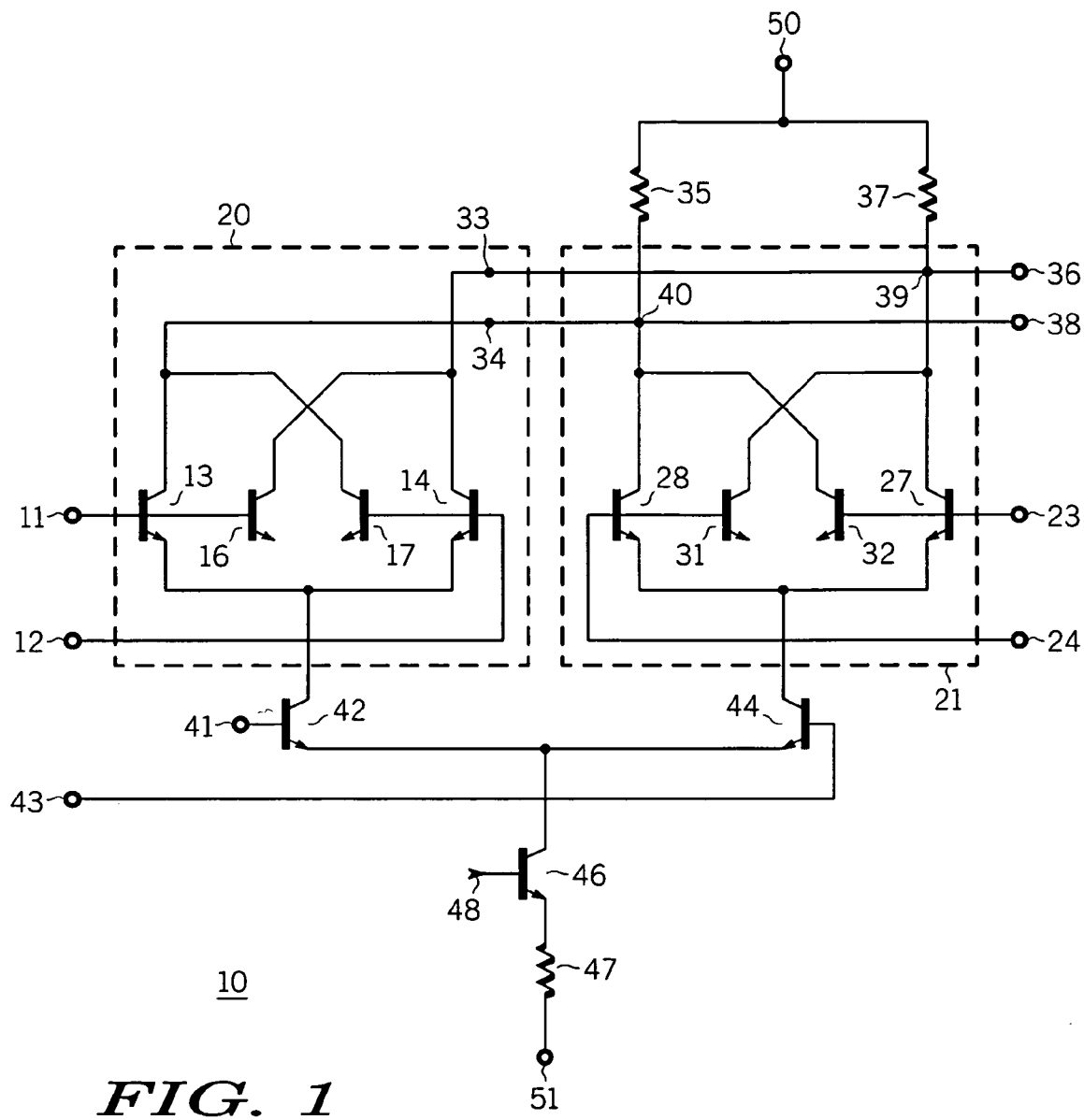
FIG. 1 schematically illustrates an embodiment of a portion of a circuit that reduces cross-talk in accordance with the present invention.

FIG. 1 schematically illustrates an embodiment of a portion of an ECL multiplexer circuit or Mux 10 that is formed to reduce cross-talk and jitter in the output signal of Mux 10. Mux 10 includes a first differential amplifier circuit or amplifier 20 and a second differential amplifier circuit or amplifier 21 that are coupled together at the outputs of amplifiers 20 and 21. Mux 10 also includes a first select switch and second select switch that are used to selectively disable either amplifier 20 or amplifier 21 during the operation of Mux 10. The first select switch is represented by a first switch transistor 42 and the second select switch is represented by a second switch transistor 44. A current source transistor 46 and a current source resistor 47 form a current source that controls the amount of current flowing through the transistors of the enabled amplifier of amplifiers 20 and 21. A bias signal generally is received on an input 48 in order to set the value of the current through transistor 46.

Mux 10 is connected between a voltage input 50 and a voltage return 51 in order to receive operating power. Amplifier 20 includes a differential pair that includes a first input transistor 13 and a second input transistor 14 that a differentially receive a first input signal and a second input signal on respective inputs 11 and 12. A collector of transistor 14 is connected to an output 33 of amplifier 20 and a collector of transistor 13 is connected to an output 34 of amplifier 20. Amplifier 20 also includes a first feed-through transistor 16 and a second feed-through transistor 17. Similarly, amplifier 21 includes a differential pair that includes a third input transistor 28 and a fourth input transistor 27 that are formed to differentially receive a third input signal and a fourth input signal on respective inputs 24 and 23. A collector of transistor 27 is connected to an output 39 of amplifier 21 and a collector of transistor 28 is connected to an output 40 of amplifier 20. Amplifier 21 also includes a third feed-through transistor 31 and a fourth feed-through transistor 32.

In operation, a differential signal is applied between select inputs 41 and 43 in order to enable one of amplifiers 20 and 21 and to disable the other amplifier. For example, if input 41 receives a voltage that is greater than input 43, transistor 42 is enabled to allow current flow through amplifier 20 to transistor 46 thereby enabling amplifier 20 and disabling amplifier 21. If the signal applied between inputs 11 and 12 changes, the value of the output signal between outputs 36 and 38 of Mux 10 also changes. Since amplifier 21 is disabled, changes in the value of the signal applied between inputs 23 and 24 should not affect the output signal. However, if the signal applied between inputs 23 and 24 changes causing the voltage between inputs 23 and 24 to toggle at some time while amplifier 21 is disabled, the collector-base capacitance of the transistor of amplifier 21 that receives the greater signal couples a corresponding parasitic voltage to the corresponding output of amplifier 21 and to the corresponding output of Mux 10. In order to minimize the effect of the parasitic change in voltage, the feed-through transistor that also receives the change in the input voltage couples a first signal that is representative of the value of the change in the input voltage applied to inputs 23 and 24 to the opposite output of amplifier 21 and to the opposite output Mux 10. For example, if amplifier 20 is enabled and the input signal to input 23 toggles by increasing to a value greater than input 24, the collector-base capacitance of transistor 27 couples a parasitic signal to corresponding output 39 of amplifier 21 and to output 36. Also, transistor 32 receives the input signal and couples a signal that is representative of the input signal to opposite output 40 of amplifier 21 and to opposite output 38 of Mux 10 thereby substantially canceling the signal coupled to output 39. The signal from transistor 32 causes outputs 36 and 38 to receive similar signals thereby minimizing the change to the differential signal between outputs 36 and 38. Similarly, if the value of the input voltage toggles again by changing to cause input 24 to receive a higher voltage than input 23 at a time while amplifier 21 is disabled, transistor 28 couples a parasitic signal to the corresponding output 40 of amplifier 21 and to output 38 of Mux 10. Transistor 31 also receives the input signal and couples a second signal that is representative of the value of the input signal to opposite output 39 of amplifier 21 and to opposite output 36 of Mux 10 in order to minimize the change in the differential signal between outputs 36 and 38. As can be seen, if the select signal between inputs 41 and 43 is reversed so that amplifier 21 is enabled and amplifier 20 is disabled, transistors 13 and 16 function similarly to the description of transistors 28 and 31. Transistor 13 couples a parasitic signal to corresponding output 34 of amplifier 20 and to output 38, and transistor 16 couples a third signal that is representative of the value of the input signal to opposite output 33 of amplifier 20 and opposite output 36 of Mux 10 in order to minimize the change in the differential voltage between outputs 36 and 38. Transistors 14 and 17 function similarly to the description of transistors 28 and 31. Transistor 14 couples a parasitic signal to corresponding output 33 of amplifier 20 and to output 36, and transistor 17 couples a fourth signal that is representative of the value of the input signal to opposite output 40 of amplifier 21 and opposite output 38 in order to minimize the change in the differential voltage between outputs 36 and 38. Minimizing the differential voltage change between outputs 36 and 38 minimizes cross-talk and reduces jitter in the output signal.

In one example embodiment, amplifier 21 is disabled and the input voltage between inputs 23 and 24 is toggled by changing by approximately two hundred (200) milli-volts. Transistor 32 couples the first signal to output 38 and substantially cancels the signal coupled to output 39 so that the value of the differential output voltage between outputs 36 and 38 changes only about one (1) milli-volt. Those skilled in the art realize that minor variations in gain and capacitance due to process and other variations generally prevent the two signals from completely canceling and that variations of up to ten to twenty percent (10%–20%) may occur between the value of the two signals. In a similar embodiment without transistors 32, 31, 16, and 17, the differential output voltage between outputs 36 and 38 changed fifteen (15) milli-volts causing cross-talk between the inputs and outputs of Mux 10 and resulting in jitter in the output signal between outputs 36 and 38. Consequently, feed-through transistors 32, 31, 16, and 17 minimize the crosstalk and jitter in the output signal of Mux 10.

In order to implement the functionality for Mux 10, input 50 is connected to a first terminal of a pull-up resistor 35 which has a second terminal connected to output 38. A first terminal of a pull-up resistor 37 is connected input 50 and a second terminal is connected to output 36. A base of transistor 13 is connected to input 11 and to a base of transistor 16. An emitter of transistor 13 is commonly connected to an emitter of transistor 14 and to a collector of transistor 42. A collector of transistor 13 is commonly connected to output 34 of amplifier 20, output 38 of Mux 10, a collector of transistor 28, a collector of transistor 32, and a collector of transistor 17. A base of transistor 17 is connected to the base of transistor 14 and to input 12. An emitter of transistor 17 is floating and is not connected. A collector of transistor 14 is commonly connected to output 33 of amplifier 20, a collector transistor 16, a collector of transistor 31, a collector of transistor 27, and output 36. An emitter of transistor 16 is not connected. An emitter of transistor 42 is connected to a collector of transistor 46 and to an emitter of transistor 44. The base of transistor 42 is connected to input 41 and a base of transistor 44 is connected to input 43. A collector of transistor 44 is commonly connected to an emitter of transistor 27 and an emitter of transistor 28. A base of transistor 31 is commonly connected to a base of transistor 28 and to input 24. A base of transistor 32 is connected to a base of transistor 27 and to input 23. The base of transistor 46 is connected to input 48 and an emitter is connected to a first terminal of resistor 47. Second terminal of resistor 47 connected to return 51.

Figure 2:
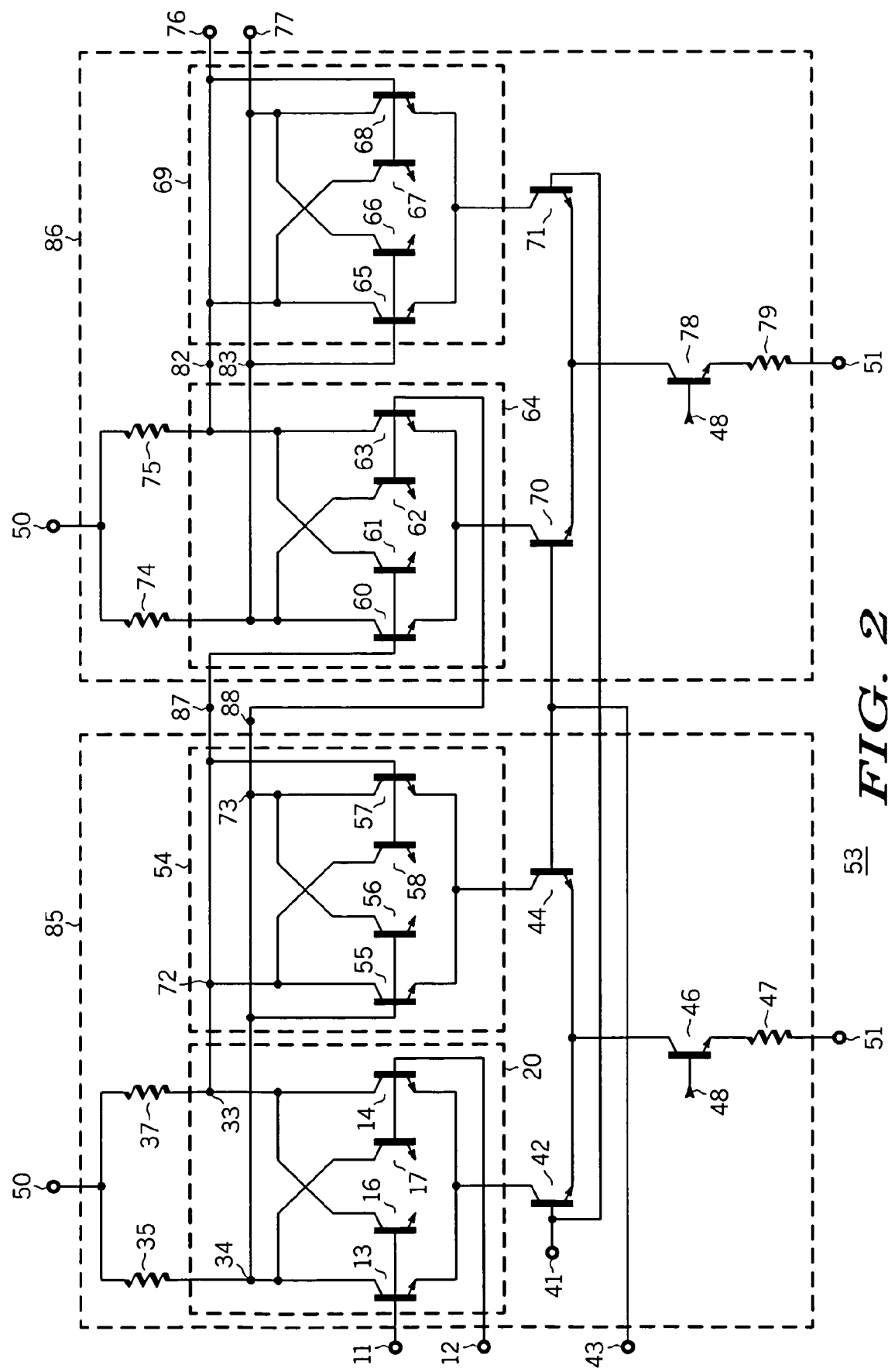
FIG. 2 schematically illustrates a portion of an embodiment of another circuit that reduces cross-talk in accordance with the present invention.

FIG. 2 schematically illustrates a portion of an embodiment of a D type ECL flip-flop 53 that minimizes crosstalk and jitter in the output signal of flip-flop 53. Flip-flop 53 has a master section 85 that forms output signals on outputs 87 and 88, and a slave section 86 that receives the signals on outputs 87 and 88 and forms a Q output of flip-flop 53 on outputs 76 and 77. Master section 85 includes first differential amplifier 20 and a second differential amplifier 54. Amplifier 54 is coupled to receive the output signals from outputs 33 and 34 of amplifier 20 as input signals to amplifier 54. Slave section 86 includes a third differential amplifier 64 and a fourth differential amplifier 69.

Because of the flip-flop configuration, inputs 11 and 12 of amplifier 20 are formed to function as the D input and receive the data input signal applied to flip-flop 53. Also, inputs 41 and 43 function to receive the clock signal applied to flip-flop 53 and responsively clock the value of the signals on inputs 11 and 12 into flip-flop 53. Signal outputs 76 and 77 are coupled to the outputs of amplifiers 64 and 69 in order to form the Q output of flip-flop 53.

Amplifier 54 includes a third input transistor 55 and a fourth input transistor 57 that form a differential pair. Amplifier 54 also includes third and fourth feed-through transistors 56 and 58 that are similar to respective transistors 31 and 32 illustrated in FIG. 1. If amplifier 54 is disabled and the inputs of amplifier 20 change to cause the output signal on outputs 33 and 34 of amplifier 20 to toggle to force the base of transistor 57 higher than the base of transistor 55, the collector-base capacitance of transistor 57 couples a parasitic signal to corresponding output 73 of amplifier 54 and to output 88 of section 85. Also, transistor 58 receives the input signal and couples a signal that is representative of the input signal to opposite output 72 of amplifier 54 and to opposite output 87 of section 85. The signal from transistor 58 causes outputs 87 and 88 to receive similar signals thereby minimizing the change to the differential signal between outputs 87 and 88. Similarly, if the value of the input voltage toggles again to force the base of transistor 55 higher than the base of transistor 57, the collector-base capacitance of transistor 55 couples a parasitic signal to the corresponding output 72 of amplifier 54 and to output 87 of section 85. Transistor 56 also receives the input signal and couples a second signal that is representative of the value of the input signal to opposite output 73 and to opposite output 88 in order to minimize the change in the differential signal between outputs 87 and 88.

Amplifiers 64 and 69 function similarly to amplifiers 20 and 54 with amplifier 64 receiving the input signals from outputs 87 and 88 of section 85, and amplifier 69 receiving the input signals from outputs 82 and 83 of amplifier 64. Amplifier 64 has outputs 82 and 83 and includes a fifth input transistor 60 and a sixth input transistor 63 that form a differential pair. Amplifier 64 also includes fifth and sixth feed-through transistors 61 and 62 that are similar to respective transistors 16 and 17. Amplifier 69 has outputs 76 and 77 and includes a seventh input transistor 65 and an eighth input transistor 68 that form a differential pair. Amplifier 69 also includes seventh and eighth feed-through transistors 66 and 67 that are similar to transistors 56 and 58.

If amplifier 64 is disabled, and the output signal on outputs 87 and 88 toggle to force the base of transistor 60 higher than the base of transistor 63, the collector-base capacitance of transistor 60 couples a parasitic signal to corresponding output 83 of amplifier 64 and to output 77 of flip-flop 53. Also, transistor 61 receives the input signal and couples a signal that is representative of the input signal to opposite output 82 of amplifier 64 and to output 76 of flip-flop 53. The signal from transistor 61 causes outputs 82 and 83 to receive similar signals thereby minimizing the change to the differential signal between outputs 82 and 83. Similarly, if the value of the output signal on outputs 82 and 83 toggles to force the base of transistor 63 higher than the base of transistor 60, the collector-base capacitance of transistor 63 couples a parasitic signal to corresponding output 82 of amplifier 64 and to output 76. Transistor 62 also receives the input signal and couples a second signal that is representative of the value of the input signal to opposite output 83 and output 77 in order to minimize the change in the differential signal between outputs 82 and 83.

If amplifier 69 is disabled and the output signal on outputs 82 and 83 toggle to force the base of transistor 68 higher than the base of transistor 65, the collector-base capacitance of transistor 68 couples a parasitic signal to corresponding output 77. Also, transistor 67 receives the input signal and couples a signal that is representative of the input signal to opposite output 76. The signal from transistor 67 causes outputs 76 and 77 to receive similar signals thereby minimizing the change to the differential signal between outputs 76 and 77. Similarly, if the value of the output signal on outputs 82 and 83 toggles to force the base of transistor 65 higher than the base of transistor 68, the collector-base capacitance of transistor 65 couples a parasitic signal to corresponding output 76. Transistor 66 also receives the input signal and couples a second signal that is representative of the value of the input signal to opposite output 77 in order to minimize the change in the differential signal between outputs 76 and 77.

In order to implement this functionality for flip-flop 53, input 11 is connected to the base of transistors 13 and 16. The collector of transistor 13 is commonly connected to a collector of transistor 17, output 34 of amplifier 20, the second terminal of resistor 35, a base of transistor 55, a collector of transistor 57, a collector of transistor 56, and to a base of transistor 63. A collector of transistor 14 is commonly connected to output 33 of amplifier 20, the second terminal of resistor 37, a collector of transistor 55, a collector of transistor 58, a base of transistor 57, and a base of transistor 60. An emitter of transistor 13 is commonly connected to the emitter of transistor 14 and to the collector of transistor 42. The emitter of transistor 55 is commonly connected to the emitter of transistor 57 and to the collector of transistor 44. A base of transistor 44 is connected to a base of transistor 70 and to input 43. Input 41 is connected to the base of transistor 42 and to a base of transistor 71. The emitter of transistor 42 is connected to the emitter of transistor 44 and to the collector transistor 46. A collector for transistor 60 is commonly connected to a first terminal of resistor 74, a collector of transistor 62, the base of transistor 65, output 77, a collector of transistor 68, and a collector of transistor 66. A second terminal of resistor 74 is connected to input 50. A collector of transistor 63 is commonly connected to the collector transistor 61, the first terminal of resistor 75, output 76, a collector of transistor 65, and the collector of transistor 67. A second terminal of resistor 75 is connected to input 50. An emitter of transistor 60 is commonly connected to an emitter of transistor 63 into a collector of transistor 70. An emitter of transistor 65 is commonly connected to an emitter of transistor 68 and to a collector of transistor 71. A collector of transistor 78 is commonly connected to an emitter of transistor 70 and to an emitter of transistor 71. An emitter of transistor 78 is connected to a first terminal of resistor 79 which has a second terminal connected to return 51. A base of transistor 78 is connected to input 48.

Figure 3:
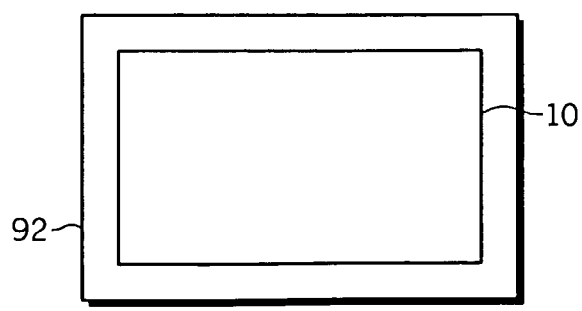
FIG. 3 illustrates an enlarged plan view of a semiconductor device that includes the circuit of FIG. 1 in accordance with the present invention.

FIG. 3 schematically illustrates an enlarged plan view of a portion of an embodiment of a semiconductor device 91 that is formed on a semiconductor die 92. Mux 10 is formed on die 92. Die 92 may also include other circuits that are not shown in FIG. 3 for simplicity of the drawing. Mux 10 and device 91 are formed on die 92 by semiconductor manufacturing techniques that are well known to those skilled in the art.

In view of all of the above, it is evident that a novel device and method is disclosed. Included, among other features, is forming a differential amplifier to be selectively disabled, receive input signals and couple representative signals to opposite outputs of the differential amplifier.

While the invention is described with specific preferred embodiments, it is evident that many alternatives and variations will be apparent to those skilled in the semiconductor arts. More specifically a method and structure has been described for a particular NPN configuration, although they are is directly applicable to other bipolar transistors, as well as to MOS, BiCMOS, metal semiconductor FETs (MESFETs), HFETs, and other transistor structures. Additionally, the word "connected" is used throughout for clarity of the description, however, it is intended to have the same meaning as the word "coupled". Accordingly, "connected" should be interpreted as including either a direct connection or an indirect connection.

The invention claimed is:

1. A cross-talk reduction circuit comprising:
    a first differential pair having a first transistor coupled to a second transistor;
    a second differential pair having a third transistor coupled to a fourth transistor;
    a first feed-through transistor configured to receive a first input signal applied to the first transistor and responsively couple a representative first signal to the fourth transistor; and
    a second feed-through transistor configured to receive a second input signal applied to the second transistor and responsively couple a representative second signal to the third transistor.

2. The cross-talk reduction circuit of claim 1 wherein a first current carrying electrode of the first transistor is coupled to a first current carrying electrode of the second feed-through transistor and to a first current carrying electrode of the third transistor.

3. The cross-talk reduction circuit of claim 2 wherein a first current carrying electrode of the second transistor is coupled to a first current carrying electrode of the first feed-through transistor and to a first current carrying electrode of the fourth transistor.

4. The cross-talk reduction circuit of claim 1 further including a third feed-through transistor configured to receive a third input signal applied to the third transistor and responsively couple a representative third signal to the second transistor.

5. The cross-talk reduction circuit of claim 4 further including a fourth feed-through transistor configured to receive a fourth input signal applied to the fourth transistor and responsively couple a representative fourth signal to the first transistor.

6. The cross-talk reduction circuit of claim 1 further including a first switch transistor configured to operably inhibit current flow through the first transistor and the second transistor when the first transistor receives the first input signal.

7. A method of forming a cross-talk reduction circuit comprising:
   configuring a first differential pair to be selectively disabled;
   coupling outputs of a second differential pair to outputs of the first differential pair; and
   configuring the first differential pair to receive a first input signal and couple a representative first signal to an output of the second differential pair.

8. The method of claim 7 wherein coupling outputs of the second differential pair to outputs of the first differential pair includes coupling a first output of the first differential pair to a first output of the second differential pair and coupling a second output of the first differential pair to a second output of the second differential pair.

9. The method of claim 7 wherein configuring the first differential pair to receive the first input signal and couple the representative first signal to the output of the second differential pair includes coupling a first feed-through transistor to receive the first input signal and responsively couple the representative first signal to a first output of the second differential pair.

10. The method of claim 9 further including coupling a second feed-through transistor of the first differential pair to receive a second input signal and responsively couple a representative second signal to a second output of the second differential pair.

11. The method of claim 7 wherein configuring the first differential pair to receive the first input signal and couple the representative first signal to the output of the second differential pair includes configuring the first differential pair couple the representative first signal to an opposite output of the second differential pair when the first differential pair is disabled.

12. The method of claim 7 further including configuring the second differential pair to receive a second input signal and couple a representative second signal to an output of the first differential pair.

13. The method of claim 12 wherein configuring the second differential pair to receive the second input signal and couple the representative second signal to the output of the first differential pair includes coupling a first feed-through transistor of the second differential pair to receive the second input signal and responsively couple a representative first signal to a first output of the first differential pair.

14. The method of claim 12 wherein configuring the second differential pair to receive the second input signal and couple the representative second signal to the output of the first differential pair includes configuring the second differential pair to couple the representative second signal to an opposite output of the first differential pair when the first differential pair is disabled.

15. A method of reducing cross-talk comprising:
   coupling outputs of a first differential pair to outputs of a second differential pair;
   configuring the first differential pair to be disabled; and
   configuring the first differential pair to receive a first input signal and responsively couple a first representative signal to an output of the second differential pair during at least a portion of a time that the first differential pair is disabled.

16. The method of claim 15 wherein configuring the first differential pair to receive the first input signal and responsively couple the first representative signal to the output of the second differential pair during at least the portion of the time that the first differential pair is disabled includes coupling a first output of the first differential pair to a first output of the second differential pair, coupling a second output of the first differential pair to a second output of the second differential pair, receiving the first input signal and responsively coupling the first representative signal to the second output of the second differential pair.

17. The method of claim 16 further including coupling a first feed-through transistor to receive the first input signal and responsively form the first representative signal.

18. The method of claim 17 further including coupling a control electrode of the first feed-through transistor to receive the first input signal, coupling a first current carrying electrode of the first feed-through transistor to the second output of the second differential pair, coupling a control electrode of a first input transistor of the first differential pair to receive the first input signal and coupling a first current carrying electrode of the first input transistor to the first output of the second differential pair.

19. The method of claim 18 further including coupling a control electrode of a second feed-through transistor to receive a second input signal, coupling a first current carrying electrode of the second feed-through transistor to the first output of the second differential pair, coupling a control electrode of a second input transistor of the first differential pair to receive the second input signal, and coupling a first current carrying electrode of the second input transistor to the second output of the second differential pair.

20. The method of claim 19 wherein configuring the first differential pair to be disabled includes coupling a switch transistor to a second current carrying electrode of the first input transistor and to a second current carrying electrode of the second input transistor.

* * * * *